(12) United States Patent
Matsumoto et al.

(10) Patent No.: US 11,319,214 B2
(45) Date of Patent: May 3, 2022

(54) WASTE LIQUID TREATING APPARATUS

(71) Applicant: DISCO CORPORATION, Tokyo (JP)

(72) Inventors: Tadaomi Matsumoto, Tokyo (JP); Masaru Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 34 days.

(21) Appl. No.: 16/931,674

(22) Filed: Jul. 17, 2020

(65) Prior Publication Data

US 2021/0024373 A1    Jan. 28, 2021

(30) Foreign Application Priority Data

Jul. 26, 2019    (JP) ............................. JP2019-137923

(51) Int. Cl.
| | |
|---|---|
| *C02F 1/00* | (2006.01) |
| *B01D 21/00* | (2006.01) |
| *B01D 21/34* | (2006.01) |
| *B01D 21/24* | (2006.01) |
| *C02F 103/34* | (2006.01) |

(52) U.S. Cl.
CPC .......... *C02F 1/004* (2013.01); *B01D 21/0012* (2013.01); *B01D 21/2494* (2013.01); *B01D 21/34* (2013.01); *C02F 1/008* (2013.01); *C02F 2103/346* (2013.01); *C02F 2209/02* (2013.01)

(58) Field of Classification Search
None
See application file for complete search history.

(56) References Cited

U.S. PATENT DOCUMENTS

2005/0139530 A1* 6/2005 Heiss .................. C02F 9/00
                                                    210/85
2018/0072600 A1* 3/2018 Fujita .................. C02F 1/44

FOREIGN PATENT DOCUMENTS

JP            2009190128 A      8/2009

* cited by examiner

*Primary Examiner* — Richard C Gurtowski
(74) *Attorney, Agent, or Firm* — Greer, Burns & Crain, Ltd.

(57) ABSTRACT

A waste liquid treating apparatus includes a waste liquid accommodating unit for waste water discharged from a processing apparatus. A waste liquid filter unit filters the waste liquid in that tank to purify the waste liquid into fresh water. A fresh water reservoir tank reserves the fresh water obtained by filtering the waste liquid by the waste liquid filter unit. A pure water producing unit purifies the fresh water reserved in the fresh water reservoir tank into pure water, and a temperature control unit controls the pure water obtained by purifying the fresh water by the pure water purifying unit to a predetermined temperature. A bubble water seal type pump sucks at least bubbles generated in the waste liquid filter unit, and a sealing water reservoir tank reserves the bubbles sucked by the bubble water seal type pump as a waste liquid.

5 Claims, 3 Drawing Sheets

WASTE LIQUID TREATING APPARATUS

BACKGROUND OF THE INVENTION

Field of the Invention

The present invention relates to a waste liquid treating apparatus for purifying a waste liquid discharged by a processing apparatus.

Description of the Related Art

A wafer formed with a plurality of devices such as integrated circuits (ICs) and large-scale integrated circuits (LSIs) on a surface in the state of being partitioned by a plurality of streets is ground on the back side by a grinding apparatus to be formed into a predetermined thickness and is thereafter divided by a dicing apparatus into individual device chips, which are used for electric apparatuses such as mobile phones and personal computers.

A processing apparatus such as the grinding apparatus and the dicing apparatus uses a large amount of pure water as processing water. Direct disposal of the processing water used for processing is uneconomical. In view of this, a waste liquid treating apparatus for purifying the used processing waste liquid discharged from the processing apparatus, to regenerate the processing water, and recirculating the regenerated processing water to reuse the processing water has been proposed by the present applicant (see Japanese Patent Laid-open No. 2009-190128).

SUMMARY OF THE INVENTION

Incidentally, in constructing a processing water circulation system using a processing apparatus and a waste liquid treating apparatus, in order to restrain deposition of cutting chips and the like onto the workpiece to be processed by a processing unit of the processing apparatus, surfactant may be mixed into processing water introduced into the processing apparatus. When this surfactant is used by being mixed into the processing water, bubbles may be generated in the waste liquid treating apparatus and may leak to the exterior, making it impossible to directly continue the operation.

It is accordingly an object of the present invention to provide a waste liquid treating apparatus by which bubbles generated in a processing region of a processing apparatus is prevented from leaking to the exterior.

In accordance with an aspect of the present invention, there is provided a waste liquid treating apparatus for purifying a waste liquid discharged from a processing apparatus, the waste liquid treating apparatus including a waste liquid accommodating tank that accommodates a waste liquid discharged by the processing apparatus, a waste liquid filter unit that filters the waste liquid in the waste liquid accommodating tank to purify the waste liquid into fresh water, a fresh water reservoir tank that reserves the fresh water obtained by filtering the waste liquid by the waste liquid filter unit, a pure water producing unit that purifies the fresh water reserved in the fresh water reservoir tank into pure water, a temperature control unit that controls the pure water obtained by purifying the fresh water by the pure water producing unit, to a predetermined temperature, a bubble water seal type pump that sucks at least bubbles generated in the waste liquid filter unit, and a sealing water reservoir tank that reserves the bubbles sucked by the bubble water seal type pump as a waste liquid. In the waste liquid treating apparatus, the waste liquid reserved in the sealing water reservoir tank is filtered by the waste liquid filter unit together with the waste liquid in the waste liquid accommodating tank, and the pure water controlled to the predetermined temperature is supplied to the processing apparatus.

Preferably, the waste liquid accommodating tank and the sealing water reservoir tank are disposed adjacent to each other through a weir, the waste liquid reserved in the sealing water reservoir tank flows over the weir into the waste liquid accommodating tank side, the waste liquid reserved in the sealing water reservoir tank is supplied through the temperature control unit to the bubble water seal type pump, to be used for cooling and operation of the bubble water seal type pump.

Preferably, the waste liquid treating apparatus further includes a spray water seal type pump that sucks a spray in a processing region where the processing unit is disposed, and the spray sucked by the spray water seal type pump is supplied to the sealing water reservoir tank.

According to the present invention, the waste liquid reserved in the sealing water reservoir tank is filtered by the waste liquid filter unit together with the waste liquid in the waste liquid accommodating tank, and the pure water controlled to the predetermined temperature is supplied to the processing apparatus. Therefore, even when surfactant is mixed into processing water and bubbles are generated upon operation of the waste liquid treating apparatus, the problem of leakage of the bubbles to the exterior of the waste liquid treating apparatus is solved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
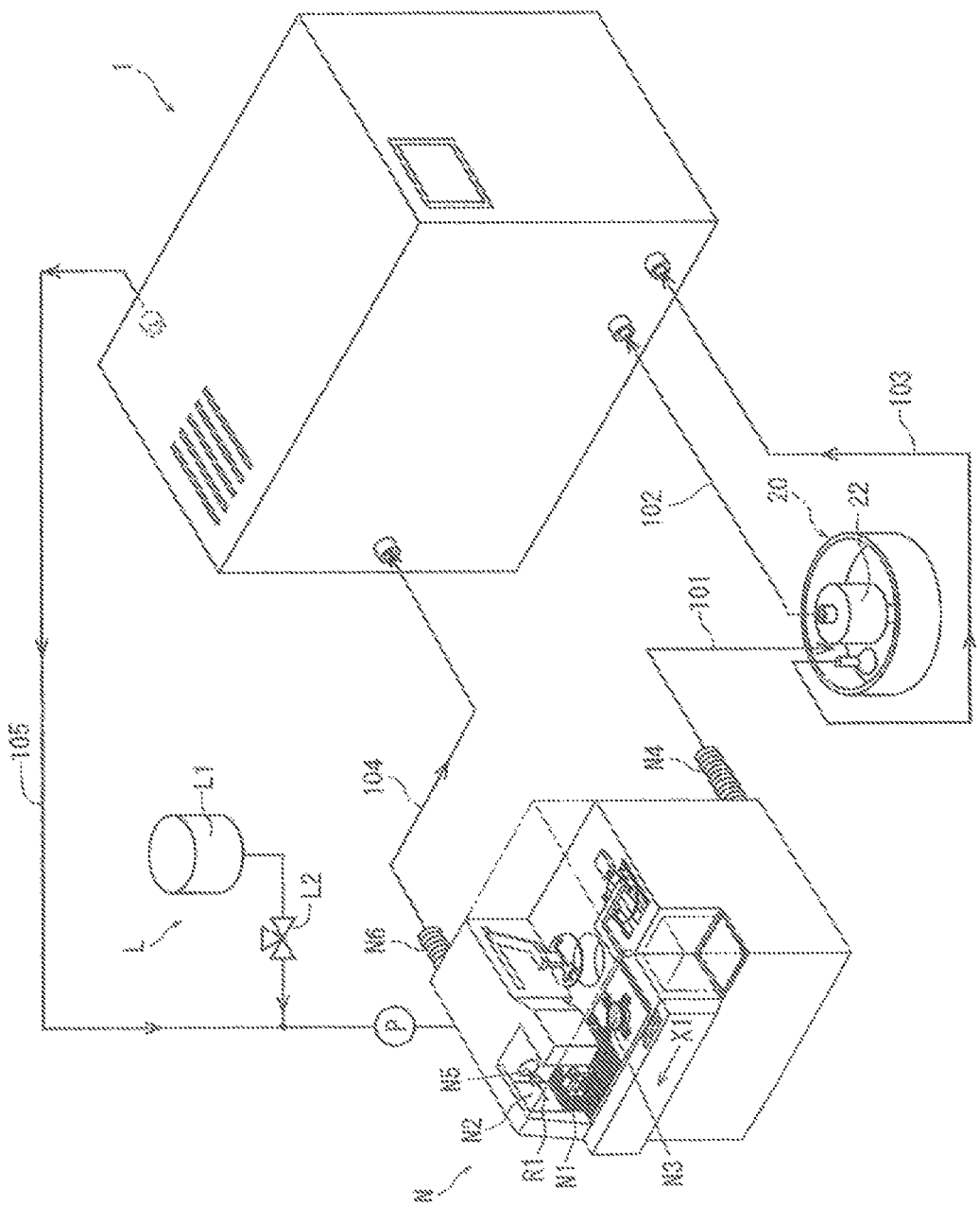
FIG. 1 is a perspective view depicting an outline of a processing water circulation system including a processing apparatus and a waste liquid treating apparatus.

A waste liquid treating apparatus according to an embodiment of the present invention will be described in detail below, referring to the attached drawings. FIG. 1 illustrates an example of a processing water circulation system which includes a waste liquid treating apparatus 1 configured based on the present embodiment and a processing apparatus N. The processing apparatus N is, for example, a dicing apparatus, which includes a cutting unit N1 as a processing unit. A workpiece, for example, a semiconductor wafer (not illustrated), held by a chuck table N3 is conveyed to a processing region N2 located in the direction indicated by an arrow X1 and is cut by the cutting unit N1. At the time of cutting the wafer in the processing region N2, processing water is supplied from the cutting unit N1 to a part to be cut, the processing water containing cutting chips or the like flows as a waste liquid, and the waste liquid is discharged through a waste liquid discharge port N4. The waste liquid discharged through the waste liquid discharge port N4 is temporarily recovered and reserved in a waste liquid sump 20 through a pipe 101. The waste liquid reserved in the waste liquid sump 20 is sent to the waste liquid treating apparatus 1 through a waste liquid discharge passage 102 by a feed pump 22 provided in the waste liquid sump 20, is purified and regenerated into pure water in the waste liquid treating apparatus 1, and the pure water is supplied through a processing water supply passage 105 to the processing apparatus N, to be reused.

In the present embodiment, in addition to the above-mentioned configuration, a bubble water seal type pump 9 which sucks bubbles generated in a waste liquid filter unit 4 is provided. In the processing region N2 of the processing apparatus N, a spray suction port N5 fronting the processing region N2 is installed, and a spray of processing water that is supplied from the cutting unit N1 to the part to be cut and that is atomized is sucked in the direction indicated by an arrow R1 via the spray suction port N5. The spray sucked through the spray suction port N5 is discharged via a spray discharge port N6 and is sent to the waste liquid treating apparatus 1 through a spray discharge passage 104. The spray sent to the waste liquid treating apparatus 1 is recovered and reserved as a waste liquid, is used for operation of a spray water seal type pump to be described later, and is purified into pure water by the waste liquid treating apparatus 1, the pure water being supplied to the processing apparatus N and being reused.

Figure 2:
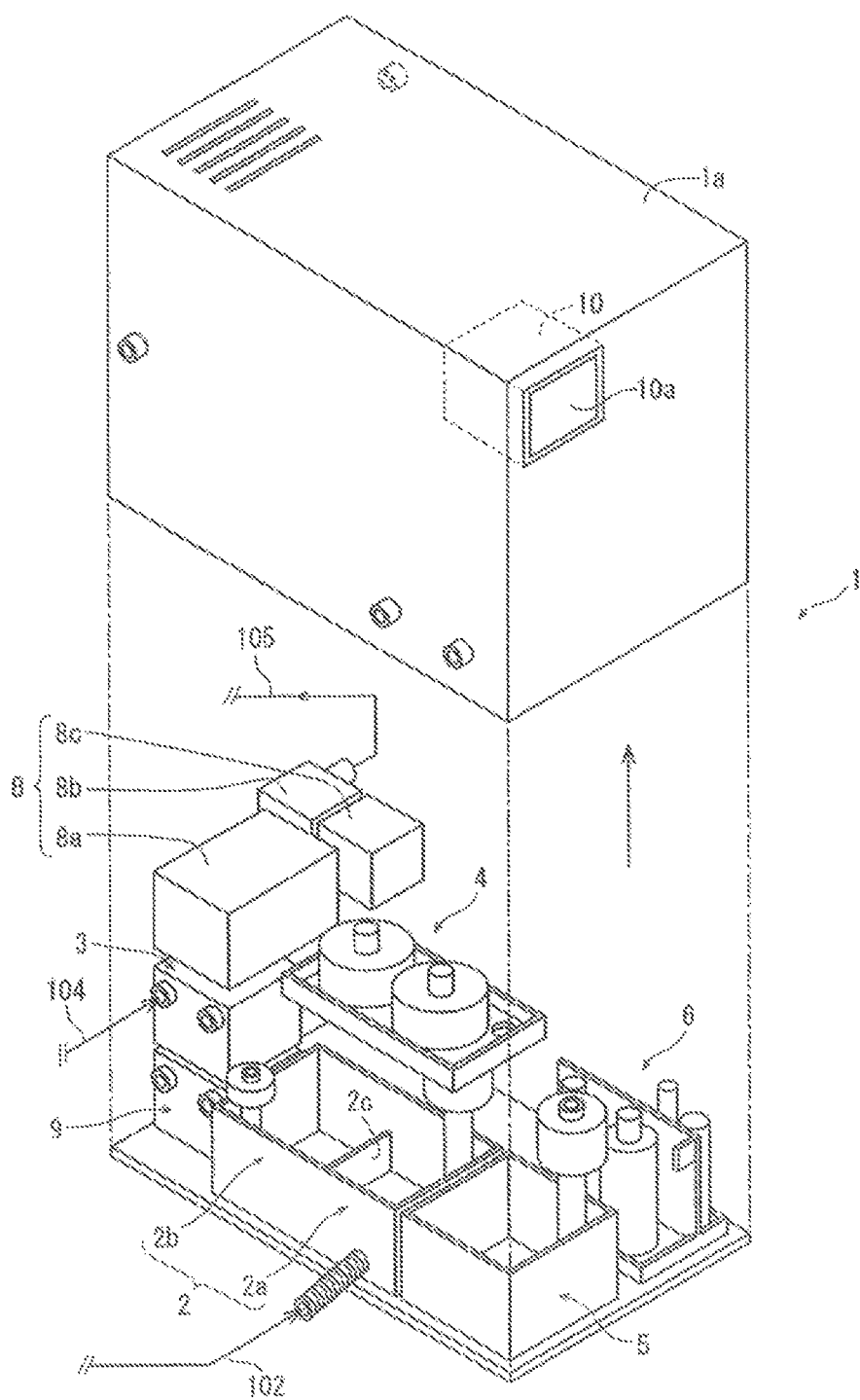
FIG. 2 is a perspective view depicting an outline of the inside of the waste liquid treating apparatus by detaching a cover member.
Figure 3:
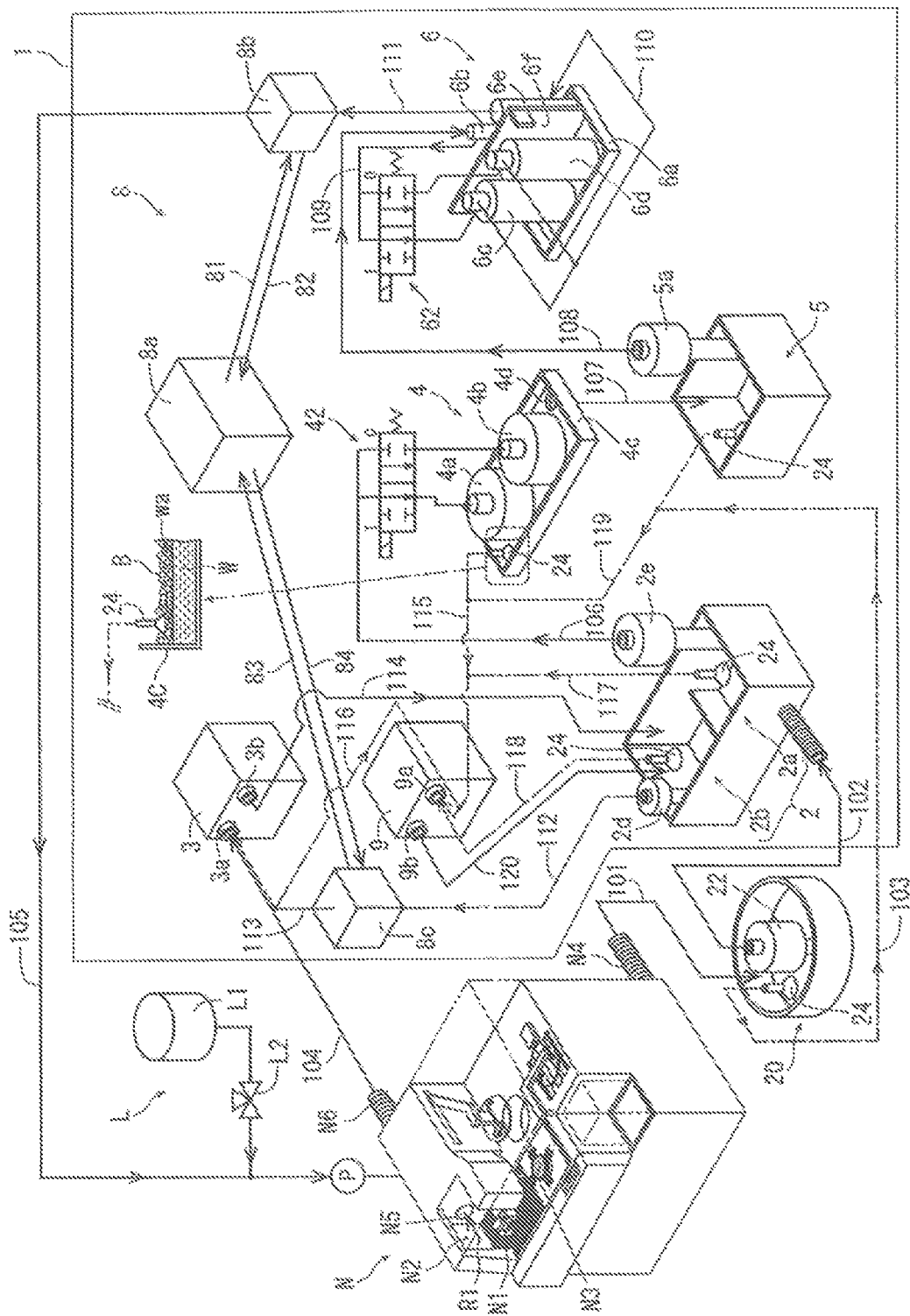
FIG. 3 is a perspective view depicting a state in which the waste liquid treating apparatus has been decomposed into its components, for explaining the operation of a circulation system.

FIG. 2 is a perspective view depicting a general outline of the waste liquid treating apparatus 1 according to the present embodiment and illustrates a state in which a cover member 1a covering the whole of the waste liquid treating apparatus 1 at normal times has been detached to the upper side and pipes for communication between the components are omitted as required. FIG. 3 depicts, in a decomposed state, the waste liquid treating apparatus 1 illustrated in FIG. 2, for explaining in detail the processing water circulation system depicted in FIG. 1; FIG. 3 illustrates the pipes for communication between the components that have been omitted in FIG. 2.

As illustrated in FIG. 2, the waste liquid treating apparatus 1 includes a waste liquid accommodating tank 2a that temporarily accommodates the waste liquid discharged by the processing apparatus N, the bubble water seal type pump 9 that sucks at least bubbles generated in the waste liquid filter unit 4, a sealing water reservoir tank 2b that recovers the bubbles sucked by the bubble water seal type pump 9 and reserves the bubbles as a waste liquid, the waste liquid filter unit 4 that filters the waste liquid in the waste liquid accommodating tank 2a and the waste liquid reserved in the sealing water reservoir tank 2b, to purify the waste liquids into fresh water, a fresh water reservoir tank 5 that reserves the fresh water obtained by filtering the waste liquid by the waste liquid filter unit 4, a pure water producing unit 6 that purifies the fresh water reserved in the fresh water reservoir tank 5 into pure water, and a temperature control unit 8 that controls the pure water obtained by purifying the fresh water by the pure water producing unit 6 to a predetermined temperature.

In the present embodiment, the waste liquid accommodating tank 2a and the sealing water reservoir tank 2b are adjacent to each other through a weir 2c to integrally constitute a reservoir tank 2. The waste liquid reserved in the sealing water reservoir tank 2b can flow over the weir 2c into the waste liquid accommodating tank 2a side. When the amount of the waste liquid reserved in the sealing water reservoir tank 2b is increased, the waste liquid flows over the weir 2c out to the waste liquid accommodating tank 2a side and is supplied to the waste liquid filter unit 4. The waste liquid reserved in the sealing water reservoir tank 2b is sent through the temperature control unit 8 to the bubble water seal type pump 9, to cool the bubble water seal type pump 9 and to be used as sealing water for operation of the bubble water seal type pump 9.

The waste liquid treating apparatus 1 includes a control unit 10 that has a display monitor 10a on the whole surface of the cover member 1a and controls each of operating sections of the waste liquid treating apparatus 1 to be described later. The display monitor 10a has a touch panel function and is used for displaying processing conditions and processing status and for inputting the processing conditions, and the like. Referring to FIG. 3 also, an operation of the waste liquid treating apparatus 1 according to the present embodiment will be described below.

When an operator instructs the control unit (not illustrated) of the processing apparatus N and the control unit 10 of the waste liquid treating apparatus 1 to start operations, operations of the processing unit N and the waste liquid treating apparatus 1 are thereby started. When the operation of the processing apparatus N is started and cutting of the wafer is started, processing water is supplied to the part to be processed, from the cutting unit N1 in the processing region N2, as described above, then, the processing water becomes a waste liquid containing cutting chips, and the waste liquid is discharged via the waste liquid discharge port N4. The waste liquid discharged via the waste liquid discharge port N4 is temporarily reserved in the waste liquid sump 20.

The waste liquid reserved in the waste liquid sump 20 is sent through the waste liquid discharge passage 102 to the waste liquid treating apparatus 1, by an operation of the feed pump 22. The waste liquid sent to the waste liquid treating apparatus 1 is accommodated in the waste liquid accommodating tank 2a. The waste liquid accommodated in the waste liquid accommodating tank 2a is sent through a pipe 106 to the waste liquid filter unit 4, by an operation of a feed pump 2e. Note that, when the amount of the waste liquid in the waste liquid accommodating tank 2a becomes small, the waste liquid is introduced from the waste liquid sump 20, as required. The waste liquid filter unit 4 includes a first filter 4a and a second filter 4b, which are disposed on a fresh water receiving pan 4c.

A solenoid on-off valve 42 is disposed on the pipe 106 that connects the feed pump 2e, the first filter 4a, and the second filter 4b. As illustrated in the drawing, in the case where the solenoid on-off valve 42 is in an OFF state and is biased to the left side (1 side) by a spring, the waste liquid sent by the feed pump 2e is led to the first filter 4a, and, when the solenoid on-off valve 42 is energized (ON) and is biased to the right side (0 side), the waste liquid sent by the feed pump 2e is led to the second filter 4b. The waste liquid led to the first filter 4a or the second filter 4b is filtered by removal of the cutting chips and the like mixed in the waste liquid, to be purified into fresh water, which flows out to the fresh water receiving pan 4c.

Though omitted from illustration, a pressure gauge connected to the control unit 10 is connected onto the pipe 106, and the pressure gauge monitors the pressure inside the pipe 106. When the filtration of the waste liquid is carried out continuously by the filter on one side, cutting chips and the like deposit on the filter to cause clogging, whereby the pressure of the pressure gauge is raised. Upon detecting this, the control unit 10 determines that the filter on the one side in connection is not functioning sufficiently, displays on the display monitor 10a of the control unit 10 an instruction for replacement of the filter on the one side, and changes the position of the solenoid on-off valve 42, whereby the flow of the waste liquid can be changed over to the filter on the other side that is not clogged. As a result, in response to the instruction from the control unit 10, the operator can replace the filter on the side on which clogging has occurred.

The fresh water filtered by the first filter 4a or the second filter 4b and having flowed out into the fresh water receiving pan 4c is discharged to and reserved in the fresh water reservoir tank 5 through a pipe 107 connected to a discharge hole 4d formed in the fresh water receiving pan 4c. The fresh water reserved in the fresh water reservoir tank 5 is sent by a feed pump 5a, as required, and is sent through a pipe 108 to a pure water producing unit 6.

The pure water producing unit 6 in the present embodiment includes a support base 6a, an ultraviolet (UV) irradiation unit 6b erected on the depth side of the support base 6a, a first ion exchange unit 6c and a second ion exchange unit 6d that are disposed on the operator's side and incorporate an ion exchange resin, a precision filter 6e disposed adjacent to the UV irradiation unit 6b, and a partition plate 6f that partitions the UV irradiation unit 6b and the precision filter 6e side and the first ion exchange unit 6c and the second ion exchange unit 6d side from each other.

The fresh water sent by the feed pump 5a and sent through the pipe 108 is first introduced into the UV irradiation unit 6b, and the introduced fresh water is irradiated with UV rays, to thereby be sterilized. The fresh water subjected to the sterilizing treatment in the UV irradiation unit 6b is introduced into the first ion exchange unit 6c or the second ion exchange unit 6d through a pipe 109. A solenoid on-off valve 62 is disposed in the pipe 109. In the case where the solenoid on-off valve 62 is in an OFF state and is biased to the left side (1 side) by a spring, the fresh water sent by the feed pump 5a is led to the first ion exchange unit 6c, and, when the solenoid on-off valve 62 is energized (ON) and is biased to the right side (0 side), the fresh water sent by the feed pump 5a is led to the second ion exchange unit 6d.

The fresh water introduced into the first ion exchange unit 6c or the second ion exchange unit 6d is subjected to ion exchange, to thereby be purified into pure water. The pure water thus obtained by ion exchange of the fresh water may contain a fine substance such as resin chips of the ion exchange resin constituting the first ion exchange unit 6c and the second ion exchange unit 6d mixed therein. In view of this, in the present embodiment, the pure water obtained through ion exchange of the fresh water by the first ion exchange unit 6c and the second ion exchange unit 6d as described above is introduced into the precision filter 6e through a pipe 110, and the fine substance such as resin chips of the ion exchange resin mixed in the pure water is trapped by the precision filter 6e, whereby the pure water is put into a state of being usable as processing water.

An unillustrated pressure detection unit for detecting the pressure of the pure water sent from the first ion exchange unit 6c or the second ion exchange unit 6d to the precision filter 6e is disposed in the pipe 110, and a detection signal of the pressure detection unit is sent to the control unit 10. When the detection signal from the pressure detection unit reaches or exceeds a predetermined value, the control unit 10 determines that a fine substance such as resin chips has deposited in the precision filter 6e and the function as a filter has been lost and displays it on the display monitor 10a provided in the control unit 10, to permit the operator to replace the precision filter. Further, though omitted from the illustration, in parallel to the above-mentioned pressure detection unit, a resistivity meter for detecting the resistivity of the pure water flowing in the pipe 110 is disposed. As a result, the state of the ion exchange resin of each of the ion exchange units can be detected, and an instruction for replacement of the ion exchange resin can be given to the operator.

The processing water purified into pure water by the pure water producing unit 6 is introduced into a heat exchanger 8b constituting the temperature control unit 8 through a pipe 111, by an operation of a pump P disposed on the processing water supply passage 105. The temperature control unit 8 includes a liquid cooler 8a for cooling liquid and circulation passages 81 and 82 for circulating the liquid cooled by the liquid cooler 8a (cooling liquid), and the heat exchanger 8b is disposed on the circulation passages 81 and 82. The processing water introduced into the heat exchanger 8b is controlled to a temperature suitable for use in the processing apparatus N, on the order of 22° C. to 23° C., by the cooling liquid circulated in the circulation passages 81 and 82, and is supplied to the processing apparatus N via the processing water supply passage 105.

In the waste liquid treating apparatus 1 of the present embodiment, the bubble water seal type pump 9 configured to suck bubbles generated in the waste liquid filter unit 4 is provided. In constituting the processing water circulation system including the processing apparatus N using the processing water, as depicted in FIG. 3, in order to restrain adhesion of cutting chips and the like onto the workpiece, a surfactant supply unit L including a surfactant reservoir tank L1 and a quantity control valve L2 is disposed on the processing water supply passage 105 for supplying processing water to the processing apparatus N, and a trace amount of surfactant is introduced into the processing water.

As described above, when the surfactant is introduced into the processing water and the waste liquid treating apparatus 1 is operated, bubbles are liable to be generated in the inside of the waste liquid treating apparatus 1, particularly in the waste liquid filter unit 4 that performs filtration by passing the waste liquid through a fine filter, and the problem of leakage of the bubbles to the exterior is generated. The bubble water seal type pump 9 in the present embodiment is provided for coping with this problem, and its operation will be described below.

A bubble suction port 24 for sucking the generated bubbles is disposed in the fresh water receiving pan 4c constituting the waste liquid filter unit 4. As a part of the fresh water receiving pan 4c is depicted in an enlarged form on the upper side in FIG. 3, the bubble suction port 24 is disposed at a position slightly higher than the position reached by a liquid surface Wa of the fresh water W having flowed out into the fresh water receiving pan 4c, such as to make contact with the bubbles denoted by B in FIG. 3 and generated on the liquid surface Wa, and is, for example, in what is generally called a horn-like shape with an opening flared out on the lower surface side.

The bubble water seal type pump 9 includes a suction hole 9a and a discharge hole 9b. Into the suction hole 9a of the bubble water seal type pump 9, the bubbles sucked from the fresh water receiving pan 4c through the bubble suction port 24 and a pipe 115 and the waste liquid reserved in the above-mentioned sealing water reservoir tank 2b are introduced. The waste liquid introduced into the bubble water seal type pump 9 is introduced through the piping 112, the heat exchanger 8c constituting the temperature control unit 8, and a pipe 116 disposed by being branched from the pipe 113, by an operation of the feed pump 2d disposed in the sealing water reservoir tank 2b, and, as in the above-mentioned heat exchanger 8b, in a state of being controlled to a predetermined temperature, for example, on the order of 22° C. to 23° C., is used for cooling the bubble water seal type pump 9 and as sealing water for operation of the bubble water seal type pump 9.

Note that in the present embodiment, the bubble suction port 24 is disposed not only in the fresh water receiving pan 4c of the above-mentioned waste liquid filter unit 4 but also in the waste liquid sump 20, the waste liquid accommodating tank 2a, the sealing water reservoir tank 2b, and the fresh water reservoir tank 5. The bubble suction port 24 disposed in the waste liquid sump 20 is connected through a pipe 103, the bubble suction port 24 disposed in the waste liquid accommodating tank 2a is connected through a pipe 117, the bubble suction port 24 disposed in the sealing water reservoir tank 2b is connected through a pipe 118, and the bubble suction port 24 disposed in the fresh water reservoir tank 5 is connected through a pipe 119, to the bubble suction hole 9a of the bubble water seal type pump 9.

When the bubbles are sucked into the bubble water seal type pump 9 through the bubble suction port 24, each pipe, and the bubble suction hole 9a, the component of the bubbles is absorbed as liquid into the waste liquid used as sealing water for the bubble water seal type pump 9, is discharged together with the waste liquid through the discharge hole 9b of the bubble water seal type pump 9, and is returned through a pipe 120 to the sealing water reservoir tank 2b, to be reserved. The component of the bubbles is reserved in the sealing water reservoir tank 2b together with the waste liquid having been used as sealing water as described above; in the case where its amount exceeds a predetermined amount, the waste liquid flows over the weir 2c into the waste liquid accommodating tank 2a side, and, as described above, the waste liquid accommodated in the waste liquid accommodating tank 2a is sequentially filtered, to be purified into pure water, as described above. Note that it is not essential to dispose the bubble suction ports 24 in all of the waste liquid sump 20, the waste liquid accommodating tank 2a, the sealing water reservoir tank 2b, and the fresh water reservoir tank 5, and the bubble suction ports 24 may selectively be disposed, as required, according to the bubble generation status.

In the present embodiment, with the bubble water seal type pump 9 provided as described above, the bubbles generated from the waste liquid are securely recovered together with the waste liquid, and the problem of leakage of the bubbles generated from the waste liquid to the exterior is solved. In addition, the recovered waste liquid is repeatedly used as sealing water for the bubble water seal type pump 9 for recovering the bubbles and is sequentially purified into pure water, to be reused as processing water.

In the present embodiment, further, a spray water seal type pump 3 that sucks a spray together with air in the processing region N2 where the cutting unit N1 of the processing apparatus N is disposed may be provided. The spray water seal type pump 3 includes a suction hole 3a and a discharge hole 3b. Into the suction hole 3a of the spray water seal type pump 3, the spray sucked from the processing region N2 of the processing apparatus N and the waste liquid reserved in the sealing water reservoir tank 2b are introduced, through a spray discharge passage 104. The waste liquid reserved in the sealing water reservoir tank 2b is introduced through a pipe 112, a heat exchanger 8c constituting the temperature control unit 8, and a pipe 113, by an operation of the feed pump 2d disposed in the sealing water reservoir tank 2b, and is used as sealing water (indicated by alternate long and short dash lines) for operation of the spray water seal type pump 3. The heat exchanger 8c is disposed on circulation passages 83 and 84 for circulating a liquid cooled in the liquid cooling section 8a (cooling liquid). The waste liquid introduced into the heat exchanger 8c is controlled to a temperature on the order of 22° C. to 23° C. by the cooling liquid circulated in the circulation passages 83 and 84 and is supplied through the pipe 113 into the spray water seal type pump 3. The spray introduced into the spray water seal type pump 3 is cooled by the waste liquid introduced into the spray water seal type pump 3 and supplied as sealing water, is separated from air introduced into the suction hole 3a, joins the waste liquid used as sealing water for operation of the spray water seal type pump 3, is discharged through the discharge hole 3b, and is returned through a pipe 114 to the sealing water reservoir tank 2b, to be reserved.

The waste liquid sent to and reserved in the sealing water reservoir tank 2b is sent to the spray water seal type pump 3 again, is used for operation of the spray water seal type pump 3, and is circulated between the sealing water reservoir tank 2b and the spray water seal type pump 3. Here, the waste liquid returned to and reserved in the sealing water reservoir tank 2b contains the waste liquid recovered by separating the spray sucked from the processing region N2 of the processing apparatus N, and, therefore, is gradually increased in amount. In the present embodiment, the waste liquid accommodating tank 2a and the sealing water reservoir tank 2b are disposed adjacent to each other through the weir 2c to constitute the reservoir tank 2; in the case where the waste liquid reserved in the sealing water reservoir tank 2b is increased in amount by the waste liquid separated from the spray and exceeds a predetermined amount, the waste liquid can flow over the weir 2c into the waste liquid accommodating tank 2a, and, as described above, the waste liquid accommodated in the waste liquid accommodating tank 2a is sequentially purified as processing water. In the present embodiment, with the above configuration provided, the spray is securely recovered as the waste liquid, and the recovered waste liquid is repeatedly used as sealing water for recovering the spray as the waste liquid and is purified into pure water, to be reused as processing water, so that the problem of being uneconomical is solved.

According to the present invention, the above-described embodiment is not limitative, and various modifications are provided. For example, while an example in which the waste liquid treating apparatus 1 of the present embodiment is applied to a dicing apparatus including a cutting unit including a cutting blade as a processing unit has been presented in the above embodiment, the present invention is not limited to this. The present invention is also applicable to other processing apparatuses for processing a workpiece by use of processing water, for example, to a grinding apparatus and a polishing apparatus.

In the above embodiment, a configuration in which the waste liquid accommodating tank 2a and the sealing water reservoir tank 2b are combined integrally through the weir 2c to form the reservoir tank 2 and the waste liquid spilling over from the sealing water reservoir tank 2b flows out via the weir 2c has been adopted, but this is not limitative of the present invention. The waste liquid accommodating tank 2a and the sealing water reservoir tank 2b may be formed of separate tanks, and, in the case where the waste liquid flowing into the sealing water reservoir tank 2b is increased in amount, the waste liquid may be sent to the waste liquid accommodating tank 2a by use of an appropriate pump.

In the above-mentioned embodiment, an example in which one processing region N2 is formed for one processing apparatus N and only one spray water seal type pump 3 is disposed correspondingly to the processing region N2 has been presented. However, for example, in the case of constructing a processing water circulation system in which a plurality of processing regions N2 are present, the spray water seal type pump 3 may be disposed according to the number of the processing regions N2.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A waste liquid treating apparatus for purifying a waste liquid discharged from a processing apparatus, the waste liquid treating apparatus comprising:
    a waste liquid accommodating tank that accommodates the waste liquid discharged by the processing apparatus;
    a waste liquid filter unit that filters the waste liquid in the waste liquid accommodating tank to purify the waste liquid into fresh water;
    a fresh water reservoir tank that reserves the fresh water obtained by filtering the waste liquid by the waste liquid filter unit;
    a pure water producing unit that purifies the fresh water reserved in the fresh water reservoir tank into pure water;
    a temperature control unit that controls the pure water obtained by purifying the fresh water by the pure water producing unit to a predetermined temperature;
    a bubble water seal type pump that sucks at least bubbles generated in the waste liquid filter unit; and
    a sealing water reservoir tank that reserves a liquid portion of the bubbles sucked by the bubble water seal type pump as a waste liquid,
    wherein the waste liquid reserved in the sealing water reservoir tank is filtered by the waste liquid filter unit together with the waste liquid in the waste liquid accommodating tank, and
    the pure water controlled to the predetermined temperature is supplied to the processing apparatus;
    wherein the waste liquid filter unit includes a fresh water receiving pan and a bubble suction port disposed in said fresh water receiving pan, the bubble suction port being configured to suck bubbles from liquid in the fresh water receiving pan.

2. The waste liquid treating apparatus according to claim 1,
    wherein the waste liquid accommodating tank and the sealing water reservoir tank are disposed adjacent to each other through a weir,
    the waste liquid reserved in the sealing water reservoir tank flows over the weir into the waste liquid accommodating tank side, and
    the waste liquid reserved in the sealing water reservoir tank is supplied through the temperature control unit to the bubble water seal type pump, to be used for cooling and operation of the bubble water seal type pump.

3. The waste liquid treating apparatus according to claim 1, further comprising:
    a spray water seal type pump that sucks a spray in a processing region where a processing unit is disposed,
    wherein the spray sucked by the spray water seal type pump is supplied to the sealing water reservoir tank.

4. The waste liquid treating apparatus according to claim 1, further comprising a control unit connected to a pipe connected between the sealing water reservoir tank and the waste liquid filter unit, wherein said control unit monitors a pressure inside the pipe.

5. The waste liquid treating apparatus according to claim 4, wherein said control unit includes a display monitor.

* * * * *